United States Patent
Chen et al.

[11] Patent Number: 5,869,394
[45] Date of Patent: Feb. 9, 1999

[54] TEOS-OZONE PLANARIZATION PROCESS

[75] Inventors: Kuang-Chao Chen, Hsin-Chu; Tuby Tu, Miao-Li, both of Taiwan

[73] Assignee: Mosel Vitelic, Inc., Hsinchu, Taiwan

[21] Appl. No.: 741,195

[22] Filed: Oct. 29, 1996

[51] Int. Cl.⁶ .............................................. H01L 21/4763
[52] U.S. Cl. ............................................. 438/624; 438/631
[58] Field of Search ........................... 438/624, 631, 438/633, 622, 789, 790

[56] References Cited

U.S. PATENT DOCUMENTS

| | | | |
|---|---|---|---|
| 5,051,380 | 9/1991 | Maeda et al. | 438/790 |
| 5,332,694 | 7/1994 | Suzuki | 438/624 |
| 5,393,708 | 2/1995 | Hsia et al. | 438/790 |
| 5,518,962 | 5/1996 | Murao | 438/624 |
| 5,618,381 | 4/1997 | Doan et al. | 438/633 |

*Primary Examiner*—John F. Niebling
*Assistant Examiner*—Michael S. Lebentritt
*Attorney, Agent, or Firm*—Tung & Associates

[57] ABSTRACT

A method for forming a planarization layer on a semiconductor device including the steps of first providing a substrate, then depositing a layer of a silicon-rich oxide material, then forming metal interconnects on the silicon-rich oxide layer, and depositing a TEOS-ozone oxide layer over the metal interconnects and the silicon-rich oxide layer such that a substantially planar surface is obtained.

9 Claims, 2 Drawing Sheets

Wafer Center

Wafer Middle

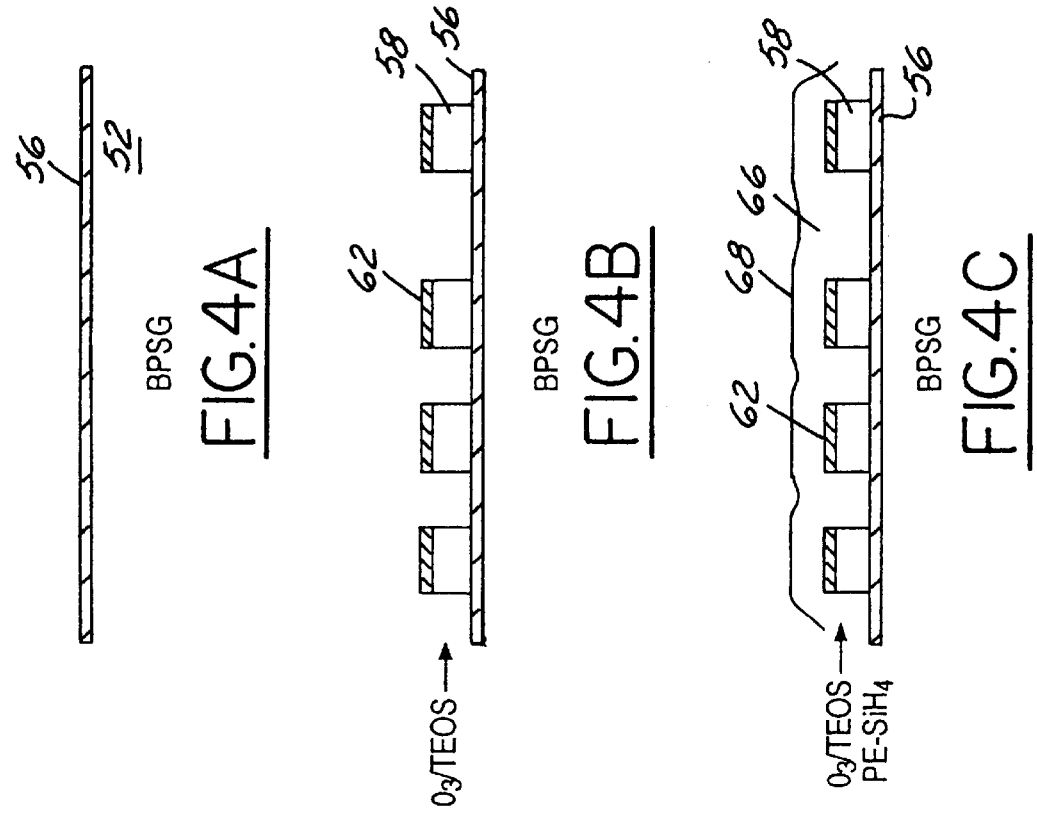

TEOS-OZONE PLANARIZATION PROCESS

FIELD OF THE INVENTION

The present invention generally relates to a method of forming planarization layers in semiconductor devices and the devices formed and more particularly, relates to a method of forming planarization layers in semiconductor devices by first depositing a silicon-rich oxide layer on a substrate for improved planarization and devices made by such method.

BACKGROUND OF THE INVENTION

In semiconductor fabrication technology, numerous active devices are built on a substrate and to enable these devices to function, interconnections between the devices formed of an electrically conductive material must be provided to either connect the devices between themselves or connect to an outside circuit. In the process of building electrically conductive interconnects, insulation must be provided between the interconnects such that they do not short with each other. The building of insulation layers in a semiconductor device can be performed by various deposition or growth techniques. For instance, an insulation layer of silicon oxide can be formed by a thermal oxidation technique, a plasma enhanced chemical vapor deposition (PECVD) of TEOS oxide technique, a PECVD silane oxide technique, an atmospheric pressure chemical vapor deposition (APCVD) technique, a PECVD TEOS-$N_2O$ technique and other suitable techniques.

The thermal oxidation technique can be used at different stages of an integrated circuit fabrication process for various purposes such as to terminate silicon bonds at a silicon surface, to isolate conductors and semiconductors, or to provide a high quality dielectric for semiconductor gates, memory cell nodes, or capacitors. The thermal oxidation method is also used to grow a sacrificial oxide film that can be removed after fulfilling its purpose. For instance, to create a step in silicon for mask alignment, to remove a certain amount of silicon that was damaged, or to serve as a screen that blocks the penetration of unwanted dopant. The thermal oxidation process can be performed by subjecting a silicon wafer to an oxidizing ambient at elevated temperatures. One of the objectives in designing an oxidizing system is the capability of providing a high quality $SiO_2$ film of uniform thickness while maintaining a low thermal budget (the product of temperature and time). Two common methods are used to grow thermal oxides of silicon, i.e., by dry oxygen and by water vapor. In both methods, silicon can be consumed and converted into $SiO_2$.

The chemical vapor deposition technique has been used for growing silicon dioxide films in the semiconductor fabrication industry. $SiO_2$ films can be deposited by a CVD method at temperatures as low as 400° C. without affecting the silicon in the substrate. The deposition temperature can be further reduced in a plasma enhanced CVD method. The oxide film properties can be controlled by the deposition and annealing conditions to fit a specific usage for the film. For instance, when used as an insulating film between conducting layers, the outside layer can be deposited in an undoped condition and then annealed to improve its density and its dielectric properties at elevated temperatures. In other applications, the oxide film can be used as a diffusion or implantation mask to prevent outdiffusion of dopants from an underlying doped film. A commonly used method to deposit silicon oxide by the chemical vapor deposition method is to oxidize silane with oxygen at low pressure and low temperature, i.e., below 450° C., or by decomposing tetraethoxysilane (TEOS) with or without oxygen at low pressure and at a higher temperature of approximately 700° C. Silicon oxide films can also be formed by the reaction of silane with nitrous oxide ($N_2O$) during which stoichiometric silicon oxide or silicon-rich oxide can be produced by varying the $N_2O/SiH_4$ ratio. Silicon oxide films can also be produced by reacting TEOS with ozone in an APCVD technique at a low reaction temperature range of 200° C.~400° C.

In a typical silane oxidation process, silane reacts with oxygen at temperatures below 500° C. to produce silicon dioxide and hydrogen. The process can be performed at low pressure and low temperature which enables the oxide film to be deposited over metals that have a low melting temperature such as aluminum and copper. The drawback of the method, however, is that the film deposited is not stoichiometric and therefore exhibits poor dielectric property and step coverage. The silane oxidation process is therefore typically used in a passivation step after metal deposition, or in combination with other insulating films. Silane or dichlorosilane can be reacted with nitrous oxides to form stoichiometric oxide films by reacting with an excess of $N_2O$ at a higher reaction temperature, i.e., between about 700° C.~900° C. The use of this process is limited since the temperature range exceeds the melting temperature of most metals used in the interconnects.

In a typical TEOS oxide process, an inert carrier gas such as nitrogen is bubbled through liquid TEOS to provide a gas mixture of TEOS in the reaction chamber and, subsequently it decomposes at a temperature between 650° C.~800° C. to produce silicon oxide and other organic byproducts. The deposition rate of the TEOS oxide film depends on the partial pressure of TEOS in the gas mixture and the reaction temperature. The TEOS chemical vapor deposition method produces films of good uniformity and step coverage. However, its requirement of high reaction temperature precludes its use over low melting temperature metal layers.

A TEOS-ozone method can be carried out in an APCVD process at reaction temperature as low as 250° C. by reacting TEOS with ozone. The oxide produced has good step coverage even in high aspect-ratio trenches or holes between metal lines. The technique is therefore more suitable for depositing oxide layers for insulating metal interconnects.

When an oxide film produced by the TEOS-ozone technique is used for insulating metal interconnects as an intermetal dielectric (IMD) layer, it is frequently deposited on a thermal oxide or a PECVD TEOS oxide underlayer. The growth of the TEOS-ozone layer has a high pattern sensitivity (or surface sensitivity). The surface sensitivity of the oxide layer to its underlayer greatly affects the quality of the oxide film produced. For instance, when deposited on a silicon wafer, the thickness of the film can vary greatly at different locations on the wafer. FIGS. 1A and 1B show a trace made from scanning electron micrographs of a cross-section of a silicon wafer at a center portion 10 and at a middle portion 20, respectively. The TEOS-ozone oxide layers 12 and 14 are deposited over a PE oxide layer 26, metal interconnects 16 and an oxide layer 18 of BPSG or PSG. The PE-oxide layer 26 can be either a PE TEOS oxide layer or a PE silane oxide. The non-uniform thickness of the layers 12 and 14 is caused by the non-uniformity in the deposition rates achieved at different regions on the wafer surface, i.e., at the wafer center, middle region or the edge. As shown in FIG. 1A, the top surface 22 of the oxide layer 12 is more smooth when compared to the top surface 24 of the oxide layer 14 shown in FIG. 1B. The slower deposition rate at the wafer middle region results in poor surface coverage and deep trenches 28 formed in the surface 24. The deep trenches 28 cannot be eliminated by a subsequent planarization process, i.e., a chemical mechanical polishing (CMP) process or a spin-on glass (SOG) process. This results in voids and porosity in the device formed on the semiconductor substrate and consequently, defective products and lower throughput rate.

An illustration of the effect of different underlayers on the deposition rates is shown in FIGS. 2A and 2B. The percent change in deposition rate is shown for TEOS-ozone oxide deposition on a bare silicon surface (used as control, or 100%), a thermal oxide surface, a PECVD TEOS oxide surface, a PECVD $SiH_4$ oxide surface, and a PECVD TEOS-$N_2O$ oxide surface. It is seen in FIG. 2A that when an oxide layer is deposited on an underlayer of thermal oxide film, the deposition rate for the oxide is reduced by 60%. When the oxide layer is deposited on an underlayer of PECVD TEOS oxide film, the deposition rate is reduced by 15%. However, no degradation in the deposition rate is seen for the TEOS-ozone oxide when it is deposited on underlayers of either a PECVD $SiH_4$ oxide layer or a PECVD TEOS-$N_2O$ oxide layer.

FIG. 2B is a bar graph showing the effect of underlayers on the wet etch rates of TEOS-ozone oxide films. The wet etch rate ratio (compared to the control of a bare silicon surface) for the oxide films deposited on a thermal oxide layer, a PECVD TEOS oxide layer, a PECVD $SiH_4$ oxide layer, and a PECVD TEOS-$N_2O$ oxide layer are shown. It is seen that when the oxide layer is deposited on either a thermal oxide layer or a PECVD TEOS oxide layer, the wet etch rate increases by almost an order of magnitude. The drastic increase in the wet etch rate is an indication that the oxide layers formed have poor film quality (or high porosity) which is likely to produce defective products due to the potential of shorting.

A typical oxide deposition process is shown in FIGS. 3A–3C. As shown in FIG. 3A, a semiconductor device 30 is provided which has metal interconnects 34 formed on an insulating BPSG layer 36. The metal interconnects 34 have an anti-reflective coating layer 38 deposited on top to facilitate the photolithiography process. The interconnects 34 are deposited of a suitable metallic material such as aluminum, copper, tungsten, tantalum, etc. and alloys thereof The anti-reflective coating layer 38 deposited on top of the metal layer can be a conventional coating material such as titanium tungsten or titanium nitride.

In a conventional deposition process for oxide, a plasma enhanced TEOS (PE TEOS) oxide layer 42 is first deposited on top of the interconnects 34 and the BPSG layer 36 on the silicon substrate. Only a thin layer of PE TEOS oxide layer is usually deposited. In the next step of the oxide planarization process, as shown in FIG. 3C, a thick layer of oxide 46 is deposited on top of the PE TEOS oxide layer 42 by a low temperature deposition process. It is seen in FIG. 3C, the surface obtained after the oxide deposition has a large step height and a poor uniformity in the thickness of the oxide layer formed. It is therefore a poor planarization process. The poor surface planarization obtained, shown in FIG. 3C, results in a poor quality of the wafer that is obtained due to the non-uniformity in the thickness of the oxide layer deposited. This is sometimes referred to as a donut formation on the surface of the wafer since at the wafer idle region, only poor oxide coverage is obtained. The poor coverage of oxide leads to a lower density film that has voids and porosity problem. The non-uniform coverage of the oxide layer on the wafer leads to a high scrap rate of the IC dies that are severed from the wafer. A lower throughput rate usually results from such an oxide deposition process.

It is therefore an object of the present invention to provide a method of forming a planarization layer of an oxide on a semiconductor device that does not have the drawbacks and shortcomings of a conventional oxide deposition processes.

It is another object of the present invention to provide a method of forming a planarization layer of an oxide on a semiconductor device that is capable of producing a device that has a substantially uniform thickness of oxide coated on top.

It is a further object of the present invention to provide a method of forming a planarization layer by an oxide deposition technique such that the occurrence of voids or porosity in the oxide film can be minimized.

It is still another object of the present invention to provide a method of forming a planarization layer of an oxide that does not require extensive changes to be made in the fabrication process.

It is another further object of the present invention to provide a method of forming a planarization layer of an oxide by first depositing a layer of a silicon-rich oxide material on top of the device prior to the forming of metal interconnects.

It is yet another object of the present invention to provide a method of forming a planarization layer of an oxide by first depositing a layer of silicon oxide on the device by a PECVD $SiH_4$ method or a PECVD TEOS-$N_2O$ method.

It is still another further object of the present invention to provide a semiconductor structure that has a substantially smooth planarization layer of TEOS-ozone oxide deposited on top.

SUMMARY OF THE INVENTION

In accordance with the present invention, a method of forming a planarization layer on a semiconductor device by first depositing a layer of silicon-rich oxide material, forming metal interconnects and then depositing an oxide layer over the metal interconnects and the silicon-rich oxide layer is provided.

In a PE, the method comprises the steps of first providing a substrate, then depositing a layer of silicon-rich oxide material by either a PECVD $SiH_4$ or a PECVD TEOS-$N_2O$ process, then forming metal interconnects on the silicon-rich oxide layer, and depositing a TEOS-ozone oxide layer to cover the metal interconnects and the silicon-rich oxide layer such that a substantially smooth planarization surface of oxide is formed. The substrate is normally covered by an insulating material such as borophosphosilicate glass, non-doped silicate glass or a phosphursilicate glass. The silicon-rich oxide material can be a silane-based oxide film which has excess silicon. The TEOS-ozone layer can be deposited by an atmospheric pressure chemical vapor deposition technique or a sub-atmospheric pressure chemical vapor deposition technique.

The present invention is further directed to a semiconductor structure that is constructed of a substrate of a semiconducting material having an insulating layer on top, a layer of a silicon-rich oxide material deposited on the insulating layer, one or more metal interconnects formed on the silicon-rich oxide layer, and a planarization layer of TEOS-ozone oxide material formed over the metal interconnects and the silicon-rich oxide layer having a substantially planar top surface. The insulating layer on the semiconducting substrate may be a borophosphosilicate glass, a non-doped silicate glass or a phosphursilicate glass. The silicon-rich oxide layer contains excess silicon in the oxide film which is substantially non-stoichiometric.

BRIEF DESCRIPTION OF THE DRAWINGS

These and other objects, features and advantages of the present invention will become apparent from the following detailed description and the appended drawings in which:

FIG. 3A is an enlarged, cross-sectional view of a device that has metal interconnects formed on an insulating layer on a wafer.

FIG. 3B is an enlarged, cross-sectional view of the device shown in FIG. 3A with a layer of plasma enhanced TEOS oxide deposited on top.

FIG. 3C is an enlarged, cross-sectional view of the device shown in FIG. 3B with a TEOS-ozone oxide layer deposited on top by a conventional method.

FIG. 4A is an enlarged, cross-sectional view of a present invention substrate having a silicon-rich oxide layer deposited on top.

FIG. 4B is an enlarged, cross-sectional view of the substrate shown in FIG. 3A with metal interconnects formed on top of the silicon-rich oxide layer.

FIG. 4C is an enlarged, cross-sectional view of the device shown in FIG. 4B with a TEOS-ozone oxide layer deposited on top by the present invention method.

DETAILED DESCRIPTION OF THE PREFERRED EMBODIMENT

The present invention method provides a planarization layer of TEOS-ozone oxide on a semiconductor device by first depositing a layer of a silicon-rich oxide material on a substrate and then forming metal interconnects and depositing a TEOS-ozone oxide layer over the metal interconnects and the silicon-rich oxide layer such that a substantially planar surface is obtained.

Figure 1A:
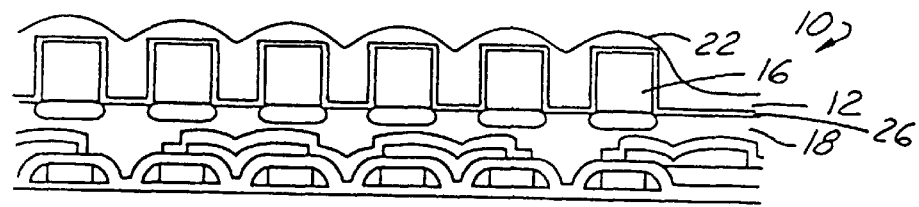
FIGS. 1A and 1B illustrate traces from a scanning electron micrograph of the cross-section of a wafer deposited by a conventional TEOS-ozone oxide process on a PE TEOS oxide layer showing the wafer center region and the wafer middle region, respectively.
Figure 1B:
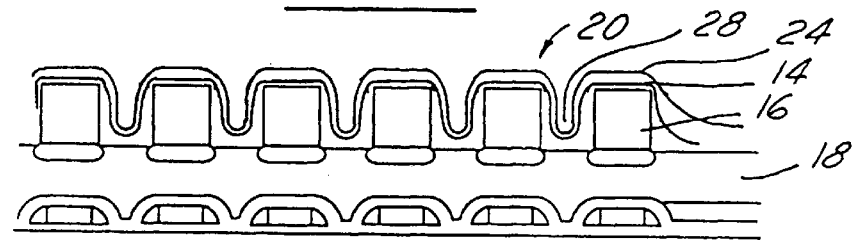
Figure 2A:
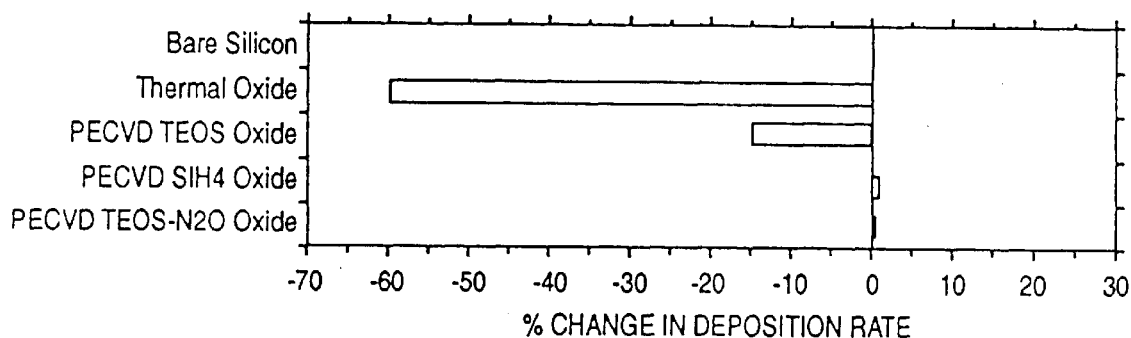
FIG. 2A is a graph showing the dependence of the TEOS-ozone oxide deposition rate on different underlayers.
Figure 2B:
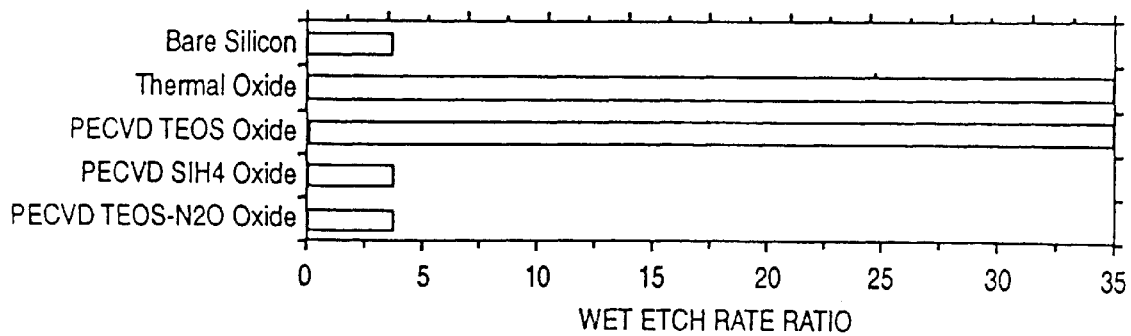
FIG. 2B is a graph showing the dependent of the TEOS-ozone oxide wet etch rate on different underlayers.

Referring now to FIG. 4A where it is shown a substrate 50 having a BPSG layer 52 deposited on top. A silicon-rich oxide layer 56 is then deposited on top of the BPSG layer 52. The deposition of the silicon-rich oxide layer can be conducted by either one of two techniques. First, by a plasma enhanced chemical vapor deposition of $SiH_4$ oxide method or second, by a plasma enhanced chemical vapor deposition TEOS-$N_2O$ oxide methods. In the second method, when the ratio of $N_2O$ to $SiH_4$ is reduced, the reaction of silane with nitrous oxide produces an oxide film with excess silicon. For instance, when the gas-phase ratio of $N_2O/SiH_4$ is approximately 3, the oxide film produced has up to approximately 14% excess silicon. For the purpose of the present invention, any oxide film that has excess silicon of 3% or more is called a silicon-rich oxide. Either one of the techniques produces a silicon-rich oxide layer that has a surface behaves similarly to a bare silicon when used as an underlayer in a TEOS-ozone oxide deposition. As shown in FIG. 2A, the TEOS-ozone oxide deposition rate when conducted on a PECVD $SiH_4$ oxide surface is similar to the deposition rate conducted on a bare silicon surface. No reduction in the deposition rate was observed. A similar behavior is seen when the TEOS-ozone oxide is deposited on a PECVD TEOS-$N_2O$ oxide layer wherein the deposition rate achieved is also similar to that on a bare silicon surface. The wet etch rate determination, which is shown in FIG. 2B, is frequently used as an indication for the quality of an oxide film obtained since it is directly related to the content of voids in the film and the film density. The wet etch rate determined for TEOS-ozone oxide films deposited either on a PECVD $SiH_4$ oxide layer or on a PECVD TEOS-$N_2O$ oxide layer is similar to the wet etch rate for a TEOS-ozone oxide layer deposited on bare silicon. This is a significant improvement when compared to the deposition rate of TEOS-ozone oxide on a thermal oxide layer which suffers a 60% drop in the rate and on a PECVD TEOS oxide layer which suffers a 15% drop in the deposition rate, as shown in FIG. 2A. Similar effect is seen in the wet etch rate data shown in FIG. 2B, wherein the wet etch rate of TEOS-ozone oxide deposited on a thermal oxide layer or on a PECVD TEOS oxide layer is approximately 10 times that of the wet etch rate of the TEOS-ozone oxide layer obtained by the present invention method.

The advantages made possible by the present invention method are shown in FIGS. 4B and 4C. Metal interconnects 58 having an anti-reflective coating layer 62 on top are first built on the oxide layer 56, as shown in FIG. 4B. A TEOS-ozone oxide layer is then deposited by an atmospheric pressure chemical vapor deposition technique or a sub-atmospheric pressure chemical vapor deposition technique to produce a substantially planar top surface 68. The substantially planar top surface 68, when compared to surface 48 of FIG. 3C clearly indicates that the oxide film produced by the present invention method has a smaller pattern sensitivity and therefore a more planar surface. It should be noted that frequently, an additional step of planarizing the TEOS-ozone oxide layer is performed by depositing a plasma enhanced TEOS oxide layer on top of the TEOS-ozone oxide layer 66 (not shown). The deposition temperature used in depositing the present invention TEOS-ozone oxide layer is in the range between about 350° C. and about 450° C. The chamber pressure used is in the range between about 400 Torr and about 760 Torr. The reactant gas flow rate for $O_3$ is at 5000±1000 sccm and for TEOS is at 2300±1000 sccm. A suitable thickness for the TEOS-ozone oxide layer 66 is more than 2000 Å obtained at a deposition rate between about 400 Å/min and about 2000 Å/min.

A suitable material used for the metal interconnects 58 can be anyone of suitable conductive metals or metal alloys, such as Al/Cu/Si, W, etc. A suitable thickness of the metal interconnects can be between about 3,000 Å and about 6,000 Å.

Other advantages made possible by the present invention method are the significantly reduced step height in the TEOS-ozone oxide layer built, a higher density of the oxide layer and a higher deposition rate which leads to a higher throughput. Additionally, a wider process window for the TEOS-ozone oxide deposition process is also obtained.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the inventions.

The embodiment of the invention in which an exclusive property or privilege is claimed are defined as follows:

1. A method of forming a planarization layer on a semiconductor device comprising the steps of:
   providing a substrate;
   depositing a layer of silicon-rich oxide material;
   forming metal interconnects on said silicon-rich oxide layer; and
   depositing an TEOS-ozone oxide layer over said metal interconnects and said silicon-rich oxide layer.

2. A method according to claim 1, wherein said substrate is formed of an insulating material.

3. A method according to claim 1, wherein said substrate is formed of an insulating material selected from the group consisting of borophosphosilicate glass, non-doped silicate glass and phosphosilicate glass.

4. A method according to claim 1, wherein said silicon-rich oxide layer is deposited by an atmospheric pressure chemical vapor deposition method or a plasma enhanced chemical vapor deposition method.

5. A method according to claim 1, wherein said metal interconnects are formed of an Al/Cu/Si alloy.

6. A method according to claim 1, wherein said metal interconnects are formed in a thickness of between about 3,000 Å and about 6,000 Å.

7. A method according to claim 1, wherein said TEOS-ozone oxide layer is deposited by an atmospheric pressure chemical vapor deposition or a sub-atmospheric pressure chemical vapor deposition process.

8. A method according to claim 1 further comprising the steps of planarizing said TEOS-ozone oxide layer and then depositing a plasma enhanced TEOS layer on top.

9. A method according to claim 1, wherein said metal interconnects further comprising an anti-reflective coating layer on top.

* * * * *